US005253180A

United States Patent [19]

Yamagiwa et al.

[11] Patent Number: 5,253,180

[45] Date of Patent: Oct. 12, 1993

[54] APPARATUS AND METHOD FOR DIAGNOSIS OF POWER APPLIANCES

[75] Inventors: Tokio Yamagiwa; Kiyoshi Okumura; Yoshinori Tagawa, all of Hitachi, Japan

[73] Assignee: Hitachi, Ltd., Tokyo, Japan

[21] Appl. No.: 524,455

[22] Filed: May 16, 1990

[30] Foreign Application Priority Data

Jun. 2, 1989 [JP] Japan .................................. 1-139056

[51] Int. Cl.[5] .............................................. G01R 31/08

[52] U.S. Cl. ............................... 364/485; 364/551.01; 324/536; 324/544

[58] Field of Search ........................... 364/485, 551.01; 324/536, 541, 544, 557, 630

[56] References Cited

U.S. PATENT DOCUMENTS 4,882,682 11/1989 Takasuka et al. .................... 324/536
4,929,903 5/1990 Saigo et al. .......................... 324/536
5,107,447 4/1992 Ozawa et al. .................. 364/551.01

FOREIGN PATENT DOCUMENTS 0092620 11/1983 European Pat. Off. .
0097482 8/1979 Japan .................................. 324/536

OTHER PUBLICATIONS

Miller et al, Measurement and Modeling of Switching Transients in Gas-Insulated Tramission Lines, 1987, (no month) pp. 456-460.

*Primary Examiner*—Jack B. Harvey
*Assistant Examiner*—Ellis B. Ramirez
*Attorney, Agent, or Firm*—Antonelli, Terry, Stout & Kraus

[57] ABSTRACT

A power appliance diagnosis apparatus includes a plurality of detectors provided on outer surfaces of gas-insulated casings of a power appliance for detecting the state of an insulating function and/or a current conduction function of the power appliance, a switch for time-divisionally taking in detection signals of the plurality of detectors, a frequency analyzer for performing frequency analysis on the detection signals taken in by the switch, and a controller for performing switching control of the switch.

21 Claims, 4 Drawing Sheets

2 10 3 2 10 1
30 20 30 20
32 22 12 31 21 11
LOCAL PANEL
$S_{22}$ $S_{21}$ $S_{31}$ $S_{12}$ $S_{32}$ $S_{11}$
41 40 SWITCH 4
42 50
FREQUENCY ANALYZER
72 71
CONTROLLER CONTROLLER
A/D 60
70 73 80 5
CPU O/E E/O
E/O O/E 91 CENTRAL PANEL
93
CRT CPU PRINTER
92 90

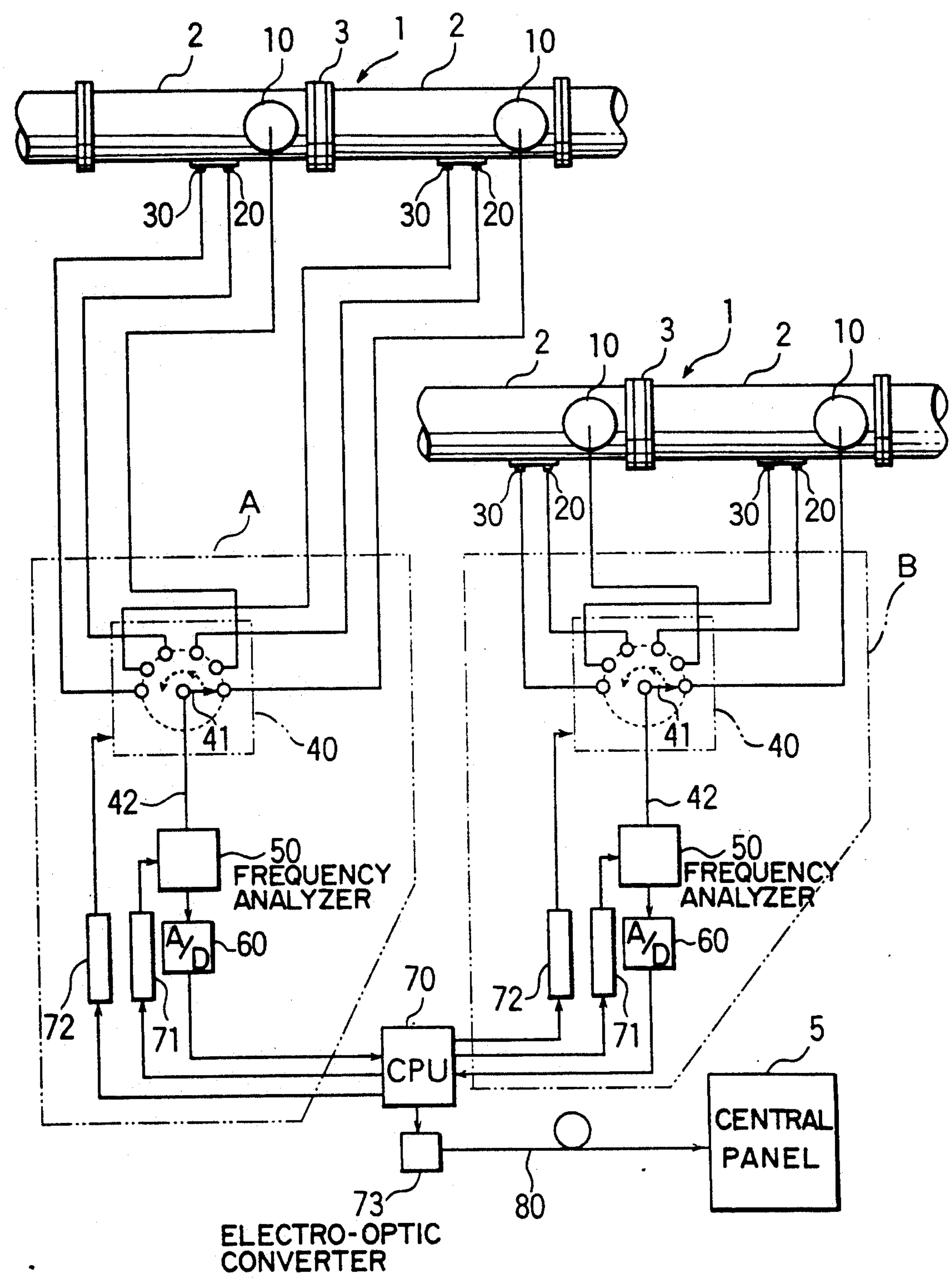
F I G. 4
2
10
3
1
2
10
30
20
30
20
2
10
3
1
2
10
30
20
30
20
A
B
41
40
41
40
42
42
50
FREQUENCY
ANALYZER
50
FREQUENCY
ANALYZER
A/D
60
A/D
60
72
71
72
71
70
CPU
5
CENTRAL
PANEL
73
ELECTRO-OPTIC
CONVERTER
80

APPARATUS AND METHOD FOR DIAGNOSIS OF POWER APPLIANCES

BACKGROUND OF THE INVENTION

The present invention relates to an apparatus and a method for diagnosis of power appliances, and, particularly, relates to a diagnosis apparatus and a diagnosis method which are suitable for diagnosing insulation, abnormal current conduction, and foreign matter mixing in gas-insulated power appliances.

In recent years, a demand for reliability of supply and for improvement in quality in environment of utilization of electric power has become greater with the advance of a highly information-oriented society and with the increase of dependency on electric power in the human living environment. With this demand, maintenance techniques for preventing accidents in operating equipment in an electric power station and for taking measurement in the event of accidents have been desired. For example, in a power appliance of a gas-insulated switchgear constituting one equipment in an electric power station, it is necessary to monitor functions thereof, such as an insulating function, a current-conduction function and the like. A method for detecting abnormality in the functions, that is, abnormality such as partial electric discharge, foreign matter mixing and the like, is described in Hitachi Review, Vol. 70, No. 3, August, 1988, pages 105 to 112.

In such a conventional technique, means for detection of partial discharge, detection of abnormal current conduction, and detection of foreign matter mixing in a power appliance is constituted by separately provided individual detection systems. In the case where there are many places to be detected, therefore, the number of detectors is increased so that the number of local panels for housing those detectors is increased. There arises therefore a problem in that not only cost becomes high but reliability is lowered because of use of a large number of detectors.

SUMMARY OF THE INVENTION

It is therefore an object of the present invention to solve the problems in the conventional technique.

It is another object of the present invention to provide an inexpensive and accurate diagnosis apparatus and a method therefor.

To attain the foregoing objects, according to an aspect of the present invention, the diagnosis apparatus for a power appliance comprises a plurality of detectors provided on the outer surface of a gas-insulated casing of the power appliance and for detecting the state of an insulating function and/or a current-conduction function of the power appliance; a switch for taking in detection signals from the plurality of detectors in time division; a frequency analyzer for performing frequency analysis on the detection signals taken into the switch; and a controller for controlling switching operation of the switch.

According to the present invention, the controller may be arranged so as to perform switching control on both the switch and the frequency analyzer so that the state of the power appliance is diagnosed by analysis means based on a value of frequency analysis obtained by the frequency analyzer and outputs the result of diagnosis.

According to the present invention, the apparatus may be provided for two systems of two-phase similar portions within one and the same circuit or of similar portions in different circuits in a substation.

According to another aspect of the present invention, the diagnosis method comprises the steps of detecting the state of an insulating function and/or a current-conduction function of the power appliance by means of a plurality of detectors provided on a casing of the power appliance; taking in detection signals from the plurality of detectors by means of a time-divisionally controlled switch; performing frequency analysis on the detection signals by means of a frequency analyzer; and diagnosing a value of the frequency analysis by means of the diagnosis apparatus to thereby diagnose the state of the power appliance.

The state of an insulating function and/or a current-conduction function of the power appliance is detected by the plurality of detectors provided on the casing of the power appliance. The detection signals are successively fed to the frequency analyzer through the switch which is time-divisionally controlled by the controller. The frequency analyzer performs frequency analysis on the respective detection signals and outputs a value of frequency analysis. In the case where the value of frequency analysis has components within a frequency band of from the order of tens of MHz to the order of hundreds of MHz, it is considered that partial electric discharge has occurred. In the case where the value has components within a frequency band of from the order of tens of Hz to the order of thousands of Hz, it is considered that abnormal current conduction has occurred. In the case where the value has components within a frequency band of from the order of tens of KHz to the order of hundreds of KHz, it is considered that mixing of foreign matter has occurred. The aforementioned method is useful for an off-line measurement on regular interval inspection.

Further, the controller may be designed so as to perform time-divisional switching control on the switch and also perform changing control on the frequency analyzer so as to cope with a frequency band detected by one of the detectors selected by the switch. This method is useful for always monitoring the result of diagnosis on line.

Other features and advantages of the present invention will be apparent from the following description taken in connection with the accompanying drawings.

BRIEF DESCRIPTION OF THE DRAWING

FIG. 4 is a circuit diagram showing a still further embodiment of the apparatus according to the present invention.

DESCRIPTION OF THE PREFERRED EMBODIMENTS

The preferred embodiments of the present invention will be described with reference to the accompanying drawings.

Figure 1:
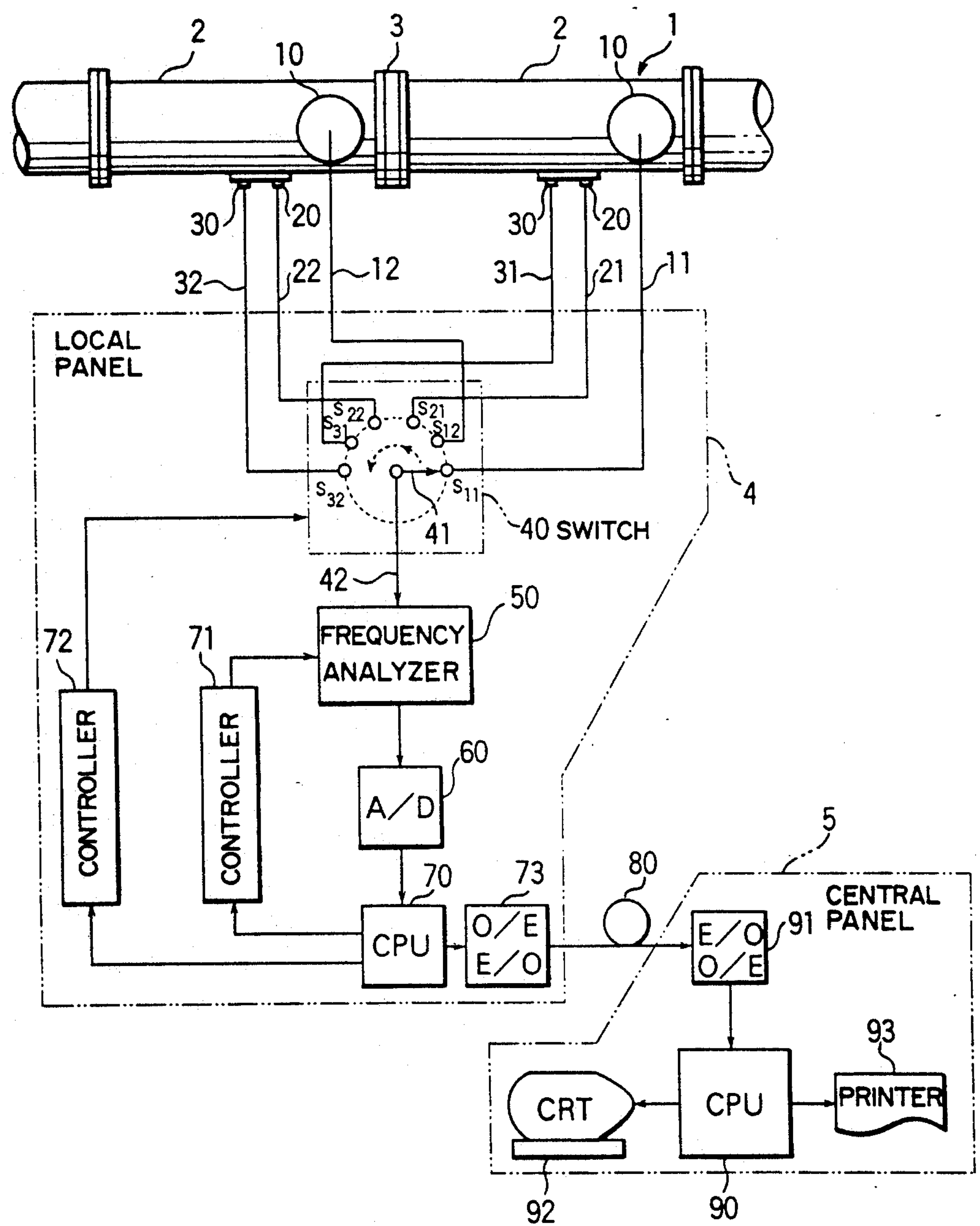
FIG. 1 is a circuit diagram showing an embodiment of the apparatus according to the present invention.

FIG. 1 illustrates an embodiment of the present invention. In this embodiment, the present invention is applied to a gas-insulated opening/closing apparatus. The gas-insulated switchgear 1 has a plurality of grounded casings 2 housing therein various types of switches and current conduction appliances, and insulating spacers 3 for separating the casings 2. Electromagnetic wave detectors 10 for detecting partial electric discharge produced in the casings 2, vibration detectors 20 for detecting abnormal current conduction in the inside of the casings 2 based on the vibration of the casings 2 and vibration detectors 30 for detecting the motion of foreign matter in the casings 2 are attached on the outer surfaces of the casings 2, respectively. The partial electric discharge decomposes insulating gas within the casings 2 to lower the insulating function of the power appliance. The partial electric discharge appears in the form of frequency components within a frequency band of from the order of tens of MHz to the order of hundreds of MHz. Similarly, the abnormal current conduction decomposes insulating gas within the casings 2 because of local heating caused by contact failure to lower the insulating function of the power appliance. The abnormal current conduction appears in the form of frequency components within a band of from the order of tens of Hz to the order of thousands of Hz. The foreign matter mixing produces partial electric discharge to thereby lower the insulating function of the power appliance in the same manner as described above. The foreign matter mixing appears in the form of frequency components within a band of from the order of tens of KHz to the order of hundreds of KHz. The electromagnetic wave detectors 10 and 10 for detecting partial electric discharge are connected to fixed contacts $S_{11}$ and $S_{12}$ of a switch 40 through transmission cables 11 and 12, respectively. The vibration detectors 20 and 20 for detecting abnormal current conduction are connected to fixed contacts $S_{21}$ and $S_{22}$ of the switch 40 through transmission cables 21 and 22, respectively. The vibration detectors 30 and 30 for detecting the motion of foreign matter are connected to fixed contacts $S_{31}$ and $S_{32}$ of the switch 40 through transmission cables 31 and 32, respectively. The fixed contacts $S_{11}$, $S_{12}$, $S_{21}$, $S_{22}$, $S_{31}$ and $S_{32}$ of the switch 40 are arranged one by one successively counterclockwise with respect to a movable contact 41 of the switch 40. The movable contact 41 of the switch 40 is connected to a frequency analyzer 50 through a transmission cable 42. The switch 40 is controlled by a controller 72 operated based on an instruction issued from a central processing unit (CPU) 70, so that the movable contact 41 is time-divisionally counterclockwise switched. The frequency analyzer 50 is controlled by a controller 71 operated based on an instruction issued from the CPU 70, so that the frequency band thereof is changed corresponding to the detector selected by the switch 40. The frequency analyzer 50 successively performs frequency analysis of detection signals from the detectors. An AD converter 60 is connected to the output of the frequency analyzer 60. The frequency-analyzed signal from the AD converter 60 is processed by the CPU 70. The switch 40, the frequency analyzer 50, the AD converter 60, the CPU 70 and the controllers 71 and 72 are provided on a local panel 4 provided in the vicinity of the power appliance. The local panel 4 and a central panel 5 provided in a building of a transformer substation are connected to each other through an electro-optic converter 73, an optical transmission cable 80 and an opto-electric converter 91. The central panel 5 has a CPU 90 for processing the received signal, and a cathode ray tube (CRT) 92 and a printer 93 used for indicating the results of processing, that is, the results of diagnosis.

The operation of the aforementioned embodiment of the present invention will be described hereunder.

The switch 40 selects the movable contact 41 under the control of the controller 72 to turn the movable contact 41 successively to the fixed contacts $S_{11}$, $S_{12}$, $S_{21}$, $S_{22}$, $S_{31}$, $S_{32}$, in that order. The frequency analyzer 50 selects the frequency detection band under the control of the controller 71 to determine the frequency band corresponding to the contact selection in the switch 40. In short, in the case where the movable contact 41 of the switch 40 is connected to either one of the fixed contacts $S_{11}$ and $S_{12}$, the frequency detection band of the frequency analyzer 50 is set in a component detection band of from the order of tens of MHz to the order of hundreds of MHz for the purpose of detecting partial electric discharge. In the case where the movable contact 41 of the switch 40 is connected to either one of the fixed contacts $S_{21}$ and $S_{22}$, the frequency detection band of the frequency analyzer 50 is set in a component detection band of from the order of tens of Hz to the order of thousands of Hz for the purpose of detecting abnormal current conduction. In the case where the movable contact 41 of the switch 40 is connected to either one of the fixed contacts $S_{31}$ and $S_{32}$, the frequency detection band of the frequency analyzer 50 is set in a component detection band of from the order of tens of KHz to the order of hundreds of KHz for the purpose of detecting the motion of foreign matter. The switching operation for the switch 40 and the frequency analyzer 50 is performed in a period of the order of seconds or minutes. Detection of partial electric discharge, detection of abnormal current conduction and detection of foreign matter, which are necessary for diagnosis of abnormality of the power appliance, can be carried out by using the connection-sequence-controlled switch 40 and the detection-frequency-band-controlled frequency analyzer 50 in combination. More in detail, the detection signals detected by the detectors 10, 20 and 30 are fed to the frequency analyzer 50 through the switch 40 which is subjected to time-divisional switching control. The frequency analyzer 50 carries out frequency analysis on the detection signals supplied thereto. The detection signals thus frequency-analyzed are fed to the CPU 70 through the AD converter 60. In the CPU 70, diagnosis of abnormality is made. The result of diagnosis is transmitted to the central panel 5 serving as a man-machine interface and then displayed on the CRT 92 and the printer 93.

As described above, according to the present invention, a plurality of time-divisionally supplied detection signals which exhibit partial discharge, abnormal current conduction, foreign matter mixing and the like in the power appliance can be analyzed by a common frequency analyzer to decide diagnosis of abnormality. Accordingly, the number of local panels can be reduced to thereby attain reduction both in size and in cost. According to this embodiment, diagnosis of abnormality can be monitored on line.

Figure 2:
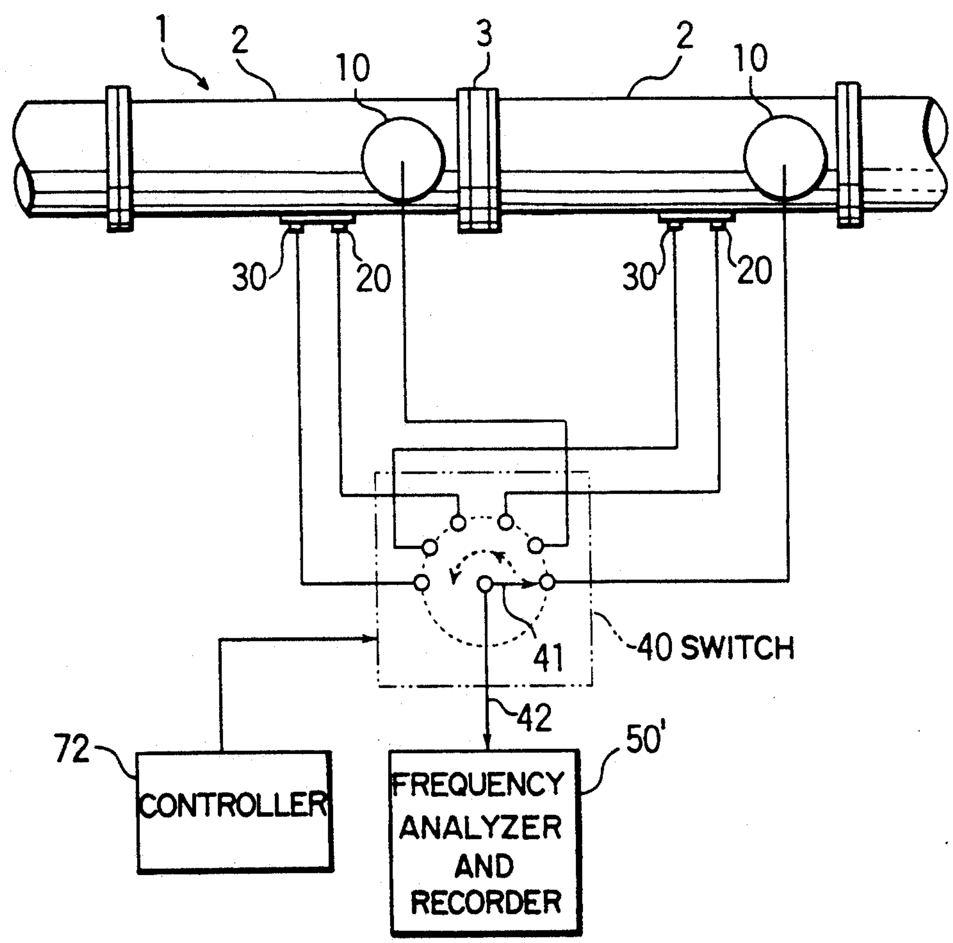
FIG. 2 is a circuit diagram showing another embodiment of the apparatus according to the present invention.

FIG. 2 illustrates another embodiment of the present invention. In FIG. 2, items the same as or equivalent to those in FIG. 1 are referenced correspondingly. In this embodiment, the detection signals from the detectors 10, 20 and 30 are successively selected through the switch 40 under the control of the controller 72 so as to be fed to the frequency analyzer 50'. In the frequency analyzer 50', the detection signals are successively frequency-analyzed and then recorded.

According to this embodiment, a plurality of time-divisionally supplied detection signals in the power appliance can be analyzed by a common frequency analyzer. As a result, the number of local panels can be reduced because the number of frequency analyzers can be reduced to one. Accordingly, reduction both in size and in cost can be attained. According to this embodiment, off-line monitoring effective for regular interval inspection in the site or local place can be made.

Figure 3:
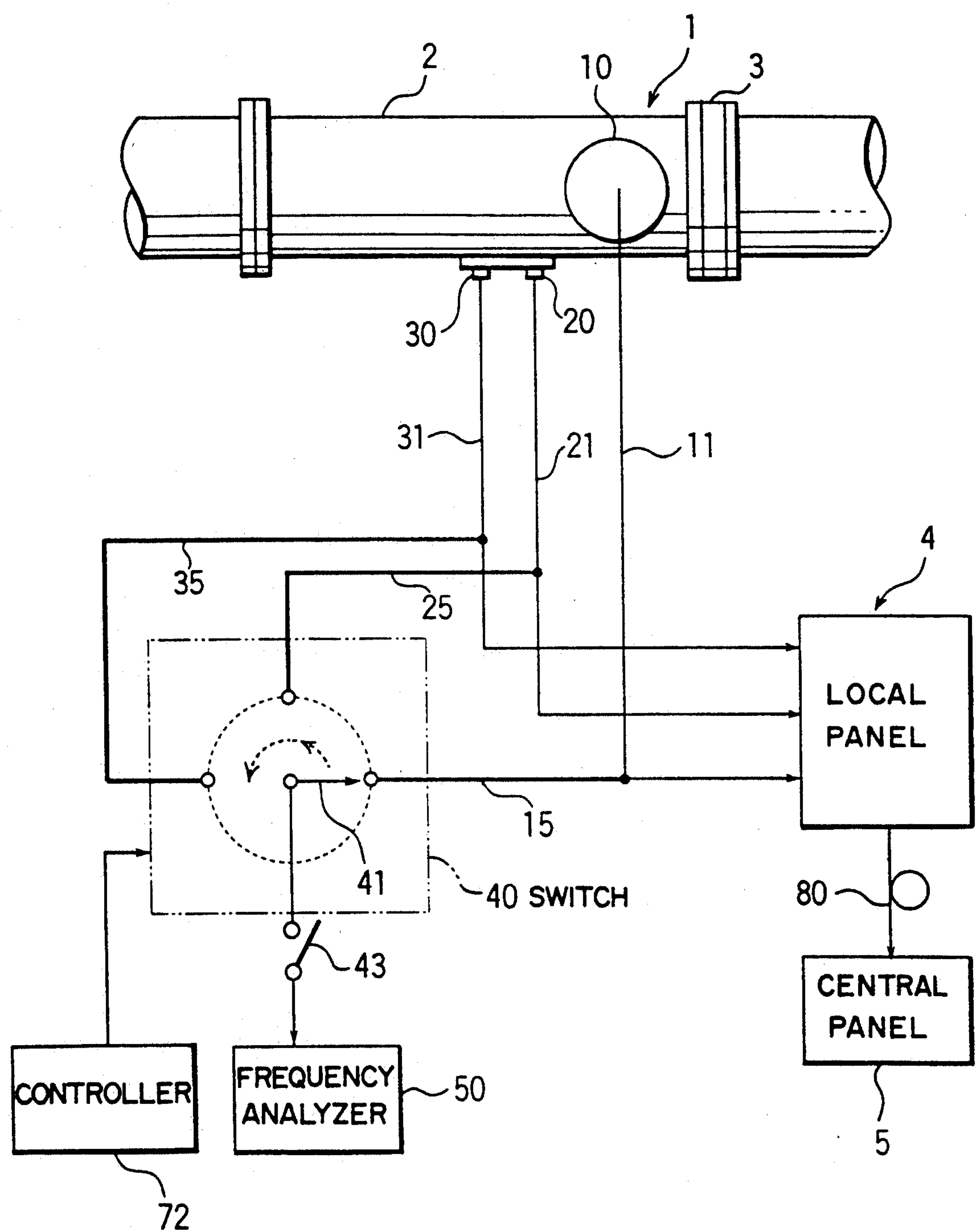
FIG. 3 is a circuit diagram showing a further embodiment of the apparatus according to the present invention.

FIG. 3 illustrates a further embodiment of the present invention. In FIG. 3, items the same as or equivalent to those in FIGS. 1 and 2 are referenced correspondingly. In this embodiment, the detection signals from the detectors 10, 20 and 30 are led to the local panel 4 through the transmission cables 11, 21 and 31. The results of diagnosis are transmitted to the central panel 5 through the transmission cable 80 so that diagnosis of abnormality can be monitored at all times. Further, transmission cables 15, 25 and 35 branched from the transmission cables 11, 21 and 31 are connected to the switch 40. The output of the switch 40 is connected to the frequency analyzer 50, so that diagnosis can be monitored also in inspection of the power appliance. In this embodiment, the local panel 4 and the central panel 5 are constructed in the same manner as in FIG. 1, so that a detailed description thereof will be omitted.

In such a configuration of this embodiment as described above, primary diagnosis can be carried out through on-line monitoring in the system of the local panel 4 and the central panel 5. In the case where a sign of abnormality is detected by the primary diagnosis, the switch 43 is closed so that a highly accurate diagnosis can be made through off-line monitoring.

According to this embodiment, not only reduction both in size and in cost can be attained in the same manner as in the aforementioned embodiment, but a highly accurate diagnosis can be made.

FIG. 4 illustrates a still further embodiment of the present invention. In FIG. 4, items the same as or equivalent to those in FIG. 1 are referenced correspondingly. In this embodiment, two systems of abnormality diagnosis apparatuses A and B are provided. Specifically, diagnosis of two systems of two-phase similar portions within one and the same circuit or of similar portions in different circuits in a substation is carried out in the same order and judged by the CPU 70.

By such a configuration in this embodiment as described above, diagnosis is carried out on two systems of similar portions which come into substantially the same condition to thereby make it possible to attain an improvement in diagnostic accuracy. This is because, in the case where a certain abnormality occurs in a gas-insulated switch gear or the like, the probability that the same abnormality occurs at the same time in a plurality of portions can be considered to be very low.

According to this embodiment, not only reduction both in size and in cost can be attained but diagnostic accuracy for two systems of similar portions can be improved.

Although this embodiment has shown the case where diagnosis is made based on comparison therebetween, it is a matter of course that the present invention is not limited to the specific embodiment. For example, diagnosis may be made in the order of the system A, the system B, the system A, .... Alternatively, upon occurrence of an abnormal system, only the system in which abnormality has occurred may be diagnosed exclusively diagnostic accuracy can be improved.

According to the apparatus of the present invention, diagnosis of a power appliance in working condition can be carried out through one and the same frequency analyzer. Accordingly, reduction both in size and cost of the apparatus can be attained.

According to the method of the present invention, inexpensive and accurate diagnosis of a power appliance in working condition can be carried out.

We claim:

1. An apparatus for performing diagnosis of a power appliance, the power appliance including current conduction appliances housed in gas-insulated casings, the apparatus comprising:

a plurality of detectors disposed on one gas-insulated casing of the power appliance for respectively detecting a plurality of mutually different phenomena respectively indicative of a plurality of mutually different conditions of the power appliance, and for respectively outputting a plurality of detection signals indicative of the respective detected phenomena;

switching means for receiving the detection signals from the detectors, and for sequentially outputting each of the detection signals in response to a switching control signal;

control means for generating a switching control signal for controlling the switching means to sequentially output each of the detections signals, and for supplying the switching control signal to the switching means;

a frequency analyzer for sequentially performing frequency analysis of the detection signals sequentially output from the switching means and for sequentially outputting frequency-analyzed signals indicative of respective results of the frequency analysis of the detection signals sequentially output from the switching means; and means for diagnosing the mutually different conditions of the power appliance based on the frequency-analyzed signals sequentially output from the frequency analyzer.

2. An apparatus according to claim 1, wherein the plurality of detectors include at least two detectors selected from a detector for detecting a phenomenon indicative of partial electric discharge in the one gas-insulated casing, a detectro for detecting a phenomenon indicative of abnormal current conduction in the one gas-insulated casing, and a detector for detecting a phenomenon indicative of mixing of foreign matter in the one gas-insulated casing.

3. An apparatus according to claim 2, wherein the switching means is constituted by a single switch.

4. An apparatus according to claim 3, wherein the switch is disposed in a local panel provided in a vicinity of the power appliance.

5. An apparatus according to claim 1, wherein the switching means is constituted by a single switch.

6. An apparatus according to claim 5, wherein the switch is disposed in a local panel provided in a vicinity of the power appliance.

7. An apparatus for performing diagnosis of a power appliance, the power appliance including switches and current conduction appliances housed in gas-insulated casings, the apparatus comprising:

a plurality of detectors disposed on one gas-insulated casing of the power appliance for respectively detecting a plurality of mutually different phenomena indicative of at least one of an insulating function of the power appliance and a current conduction function of the power appliance, and for respectively outputting a plurality of detection signals indicative of the respective detected phenomena;

switching means for receiving the detection signals from the detectors, and for sequentially outputting each of the detection signals in response to a first switching control signal;

control means for generating a first switching control signal for controlling the switching means to sequentially output each of the detections signals, and for supplying the first switching control signal to the switching means;

a frequency analyzer for sequentially performing frequency analysis of the detection signals sequentially output from the switching means and for sequentially outputting frequency-analyzed signals indicative of respective results of the frequency analysis of the detection signals sequentially output from the switching means; and means for diagnosing at lest one of the insulating function of the power appliance and the current conduction function of the power appliance based on the frequency-analyzed signals sequentially output from the frequency analyzer.

8. An apparatus according to claim 7, wherein the plurality of detectors include at least two detectors selected from a detectro for detecting a phenomenon indicative of partial electric discharge in the one gas-insulated casing, a detectro for detecting a phenomenon indicative of abnormal current conduction in the one gas-insulated casing, and a detector for detecting a phenomenon indicative of mixing of foreign matter in the one gas-insulated casing.

9. An apparatus according to claim 8, wherein the switching means is constituted by a single switch.

10. An apparatus according to claim 9, wherein the mutually different phenomena respectively detected by the detectors appear in the form of frequency components in respective mutually different frequency bands;

wherein the frequency analyzer sequentially changes a frequency band in which it performs frequency analysis to each of the mutually different frequency bands in response to a second switching control signal as it sequentially performs frequency analysis of the detection signals sequentially output from the switching means such that the frequency analyzer performs frequency analysis of the detection signals in the respective frequency bands in which the frequency components of the respective phenomena which the detection signals are indicative of appear; and wherein the control means generates a second switching control signal for controlling the frequency analyzer to sequentially change a frequency band in which it performs frequency analysis to each of the mutually different frequency bands, and supplies the second switching control signal to the frequency analyzer.

11. An apparatus according to claim 10, wherein the control means includes means for changing the first switching control signal and the second switching control signal to change an interval at which the switching means sequentially outputs each of the detection signals and at which the mutually analyzer sequentially changes a frequency band in which it performs frequency analysis to each of the mutually different frequency bands.

12. An apparatus according to claim 7, wherein the switching means is constituted by a single switch.

13. An apparatus according to claim 12, wherein the mutually different phenomena respectively detected by the detectors appear in the form of frequency components in respective mutually different frequency bands;

wherein the frequency analyzer sequentially changes a frequency band in which it performs frequency analysis to each of the mutually different frequency bands in response to a second switching control signal as it sequentially performs frequency analysis of the detection signals sequentially output from the switching means such that the frequency analyzer performs frequency analysis of the detection signals in the respective frequency bands in which the frequency components of the respective phenomena which the detection signals are indicative of appear; and wherein the control means generates a second switching control signal for controlling the frequency analyzer to sequentially change a frequency band in which it performs frequency analysis to each of the mutually different frequency bands, and supplies the second switching control signal to the frequency analyzer.

14. An apparatus according to claim 13, wherein the control means includes means for changing the first switching control signal and the second switching control signal to change an interval at which the switching means sequentially outputs each of the detection signals and at which the mutually analyzer sequentially changes a frequency band in which it performs frequency analysis to each of the mutually different frequency bands.

15. An apparatus for performing diagnosis of a first power appliance and a second power appliance, the first power appliance and the second power appliance each including switches and current conduction appliances housed in gas-insulated casings, the apparatus comprising:

a plurality of first detectors disposed on one gas-insulated casing of the first power appliance for respectively detecting a plurality of mutually different phenomena indicative of at least one of an insulating function of the first power appliance and a current conduction function of the first power appliance, and for respectively outputting a plurality of first detection signals indicative of the respective detected phenomena;

a plurality of second detectors disposed on one gas-insulated casing of the second power appliance for respectively detecting a plurality of mutually different phenomena indicative of at least one of an insulating function of the second power appliance and a current conduction function of the second power appliance, and for respectively outputting a plurality of second detection signals indicative of the respective detected phenomena, the second detectors being disposed on the one gas-insulated casing of the second power appliance at respective locations respectively corresponding to respective locations at which the first detectors are disposed on the one gas-insulated casing of the first power appliance;

first switching means for receiving the first detection signals from the first detectors, and for sequentially outputting each of the first detection signals in response to a first switching control signal;

second switching means for receiving the second detection signals from the second detectors, and for sequentially outputting each of the second detection signals in response to a second switching control signal;

first control means for generating a first switching control signal for controlling the first switching means to sequentially output each of the first detections signals, and for supplying the first switching control signal to the first switching means;

second control means for generating a second switching control signal for controlling the second switching means to sequentially output each of the second detections signals, and for supplying the second switching control signal to the second switching means;

a first frequency analyzer for sequentially performing frequency analysis of the first detection signals sequentially output from the first switching means, and for sequentially outputting first frequency-analyzed signals indicative of respective results of the frequency analysis of the first detection signals sequentially output from the first switching means;

a first frequency analyzer for sequentially performing frequency analysis of the first detection signals sequentially output from the first switching means and for sequentially outputting first frequency-analyzed signals indicative of respective results of the frequency analysis of the second detection signals sequentially output from the second switching means; and means for diagnosing at least one of the insulating function of the first power appliance and the current conduction function of the first power appliance based on the first frequency-analyzed signals sequentially output from the first frequency analyzer, and for diagnosing at least one of the insulating function of the second power appliance and the current conduction function of the second power appliance based on the second frequency-analyzed signals sequentially output from the second frequency analyzer.

16. An apparatus according to claim 15, wherein the plurality of first detectors and the plurality of second detectors each include at lest two detectors selected from a detector for detecting a phenomenon indicative of partial electric discharge in the one gas-insulated casing, a detector for detecting a phenomenon indicative of abnormal current conduction in the one gas-insulated casing, and a detector for detecting a phenomenon indicative of mixing of foreign matter in the one gas-insulated casing.

17. An apparatus according to claim 16, wherein the mutually different phenomena respectively detected by the first detectors and the second detectors appear in the form of frequency components in respective mutually different frequency bands;

wherein the first frequency analyzer sequentially changes a frequency band in which it performs frequency analysis to each of the mutually different frequency bands in response to a third switching control signal as it sequentially performs frequency analysis of the first detection signals sequentially output from the first switching means such that the first frequency analyzer performs frequency analysis of the first detection signals in the respective frequency bands in which the frequency components of the respective phenomena which the first detection signals are indicative of appear;

wherein the second frequency analyzer sequentially changes a frequency band in which it performs frequency analysis t each of the mutually different frequency bands in response to a fourth control signal as it sequentially performs frequency analysis of the second detection signals sequentially output from the second switching means such that the second frequency analyzer performs frequency analysis of the second detection signals in the respective frequency bands in which the frequency components of the respective phenomena which the second detection signals are indicative of appear; and wherein the first control means generates a third switching control signal for controlling the first frequency analyzer to sequentially change a frequency band in which it performs frequency analysis to each of the mutually different frequency bands, and supplies the third switching control signal to the first frequency analyzer; and wherein the second control means generates a fourth switching control signal for controlling the second frequency analyzer to sequentially change a frequency band in which it performs frequency analysis to each of the mutually different frequency bands, and supplies the fourth switching control signal to the second frequency analyzer.

18. An apparatus according to claim 17, wherein the first control means includes means for changing the first switching control signal and the third switching control signal to change an interval at which the first switching means sequentially outputs each of the first detection signals and at which the first mutually analyzer sequentially changes a frequency band in which it performs frequency analysis to each of the mutually different frequency bands; and wherein the second control means includes means for changing the second switching control signal and the fourth switching control signal to change an interval at which the second switching means sequentially outputs each of the second detection signals and at which the second mutually analyzer sequentially changes a frequency band in which it performs frequency analysis to each of the mutually different frequency bands.

19. An apparatus according to claim 17, further comprising:

means for determining if an abnormality exists in the first power appliance based on the at least one of the insulating function of the first power appliance and the current conduction function of the first power appliance diagnosed by the diagnosing means, and for determining if an abnormality exists in the second power appliance based on the at least one of the insulating function of the second power appliance and the current conduction function of the second power appliance diagnosed by the diagnosing means; and means for preventing the first control means from generating the first switching control signal and the third switching control signal if the determining means determines that an abnormality exist in the second power appliance, and for preventing the second control means from generating the second switching control signal and the fourth switching control signal if the determining means determines that an abnormality exists in the first power appliance.

20. A method of performing diagnosis of a power appliance, the power appliance including switches and current conduction appliances housed in gas-insulated casings, the method comprising the steps of:

respectively detecting a plurality of mutually different phenomena indicative of at least one of an insulating function of the power appliance and a current conduction function of the power appliance with a plurality of detectors disposed on one gas-insulated casing of the power appliance, the plurality of detectors respectively outputting a plurality of detection signals indicative of the respective detected phenomena;

sequentially selecting each of the detection signals from the detectors;

sequentially performing frequency analysis of the sequentially selected detection signals with a frequency analyzer, the frequency analyzer sequentially outputting frequency-analyzed signals indicative of respective results of the frequency analysis of the sequentially selected detection signals; and diagnosing at least one of the insulating function of the power appliance and the current conduction function of the power appliance based on the frequency-analyzed signals sequentially output from the frequency analyzer.

21. A method according to claim 20, wherein the mutually different pehnomena respectively detected by the detectors appear in the form of frequency components in respective mutually different frequency bands; and wherein the step of sequentially performing frequency analysis of the sequentially selected detection signals with a frequency analyzer includes sequentially changing a frequency band in which the frequency analyzer performs frequency analysis to each of the mutually different frequency bands while sequentially performing frequency analysis of the sequentially selected detection signals such that the frequency analyzer performs frequency analysis of the detection signals in the respective frequency bands in which the frequency components of the respective pehnomena which the detection signals are indicative of appear.

* * * * *